(12) United States Patent
Burkatovsky (10) Patent No.: US 7,420,152 B2
(45) Date of Patent: Sep. 2, 2008

(54) WIDE-RANGE LINEAR OUTPUT PHOTO SENSOR CIRCUIT

(75) Inventor: Vitaly Burkatovsky, Rishon Le Zion (IL)

(73) Assignee: Eastman Kodak Company, Rochester, NY (US)

( * ) Notice: Subject to any disclaimer, the term of this patent is extended or adjusted under 35 U.S.C. 154(b) by 73 days.

(21) Appl. No.: 11/517,076

(22) Filed: Sep. 7, 2006

(65) Prior Publication Data

US 2008/0061217 A1    Mar. 13, 2008

(51) Int. Cl.
*H03F 1/36* (2006.01)

(52) U.S. Cl. ............... 250/214 AG; 330/85; 250/214 A (58) Field of Classification Search ........... 250/214 AG, 250/214 A, 208.1; 330/308, 301, 85, 86
See application file for complete search history.

(56) References Cited

U.S. PATENT DOCUMENTS

| | | | |
|---|---|---|---|
| 5,014,238 A | 5/1991 | McLeish et al. | |
| 5,276,630 A | 1/1994 | Baldwin et al. | |
| 5,306,995 A | 4/1994 | Payne et al. | |
| 5,339,022 A | 8/1994 | Fleming et al. | |
| 5,412,291 A | 5/1995 | Payne et al. | |
| 5,493,650 A | 2/1996 | Reinke et al. | |
| 5,742,200 A * | 4/1998 | He | 329/320 |
| 5,950,709 A | 9/1999 | Krueger et al. | |
| 6,181,140 B1 | 1/2001 | Vokey et al. | |
| 6,404,281 B1 * | 6/2002 | Kobayashi | 330/85 |
| 6,459,271 B1 | 10/2002 | Vokey et al. | |
| 6,646,454 B2 | 11/2003 | Watkins | |
| 6,739,145 B2 | 5/2004 | Bhatnagar | |
| 6,868,357 B2 | 3/2005 | Furse | |
| 2001/0015918 A1 | 8/2001 | Bhatnagar | |
| 2001/0039190 A1 | 11/2001 | Nakamura et al. | |

FOREIGN PATENT DOCUMENTS

| | | |
|---|---|---|
| WO | WO 91/02300 | 2/1991 |
| WO | WO 02/37298 | 5/2002 |
| WO | WO 2005/029207 | 3/2005 |
| WO | WO 2005/029207 A2 | 3/2005 |
| WO | WO 2006/008732 | 1/2006 |

OTHER PUBLICATIONS

Vitaly Burkatovsky, "An Adaptive Input-Cell Circuitry Useful in Configurable Electronic Controllers", pending patent application filed Jun. 21, 2006.

(Continued)

*Primary Examiner*—Georgia Y. Epps
*Assistant Examiner*—Tony Ko
(74) *Attorney, Agent, or Firm*—Roland R. Schindler, II (57) ABSTRACT

A system and method for acquisition and conditioning of a signal received from a light sensor generating an input signal in proportion to a sensed amount of light, the system utilizing an operational amplifier with first and second feedback loops to render the output signal of a control circuit, part of the second feedback loop, in proportional relationship to the input signal across the range of output signals from the light sensor.

8 Claims, 5 Drawing Sheets

OTHER PUBLICATIONS

Texas Instruments Inc., "250MHz, Rail-to-Rail I/O, CMOS Operational Amplifier with Shutdown", OPA2357, SBOS235D-Mar. 2002-revised Feb. 2005.

Texas Instruments Inc., "Precision Logarithmic and Log Ratio Amplifier", LOG 104, SBOS243C-May 2002-revised Apr. 2005.

National Semiconductor Corp., "An Applications Guide for Op Amps", Application Note 20, Feb. 1969, www.national.com.

Joseph J. DiStefano, III, Ph.D. et al., "Schaum's Outline of Theory and Problems of Feedback and Control Systems", 1990 second edition, Schaum's Outline Series, McGraw-Hill, Inc.

\* cited by examiner

WIDE-RANGE LINEAR OUTPUT PHOTO SENSOR CIRCUIT

FIELD OF THE INVENTION

The present invention relates to photo sensing circuits and to the measurement of light using photosensing circuits.

BACKGROUND OF THE INVENTION

The main functional task of a sensor is to produce an output signal representative of the detected amount or level of a measured physical phenomenon, of the type for which the sensor was pre-designed to detect. The produced output signal is then used by a wide variety of devices for different control or measurement purposes Sensors will often generate output signals that have relatively low signal strength or a high noise component. Accordingly, it is known to provide such sensors with electronic circuitry for signal conditioning of the output signal so that the conditioned output signal can be more easily or more accurately sensed, interpreted or otherwise used by a control system. Such conditioning can involve but is not limited to processes such as amplification and/or filtering. For example, one simple and well-known solution for conditioning the output signal of a photodiode sensor is to use a linear trans-impedance operational amplifier. One example of such a linear trans-impedance operational amplifier is a Burr-Brown CMOS Rail-to-Rail IO Operational Amplifier OPA2357 sold by Texas Instruments, Dallas, Tex., USA.

However, in some situations, the use of such linear amplifiers may not be appropriate. Wide range sensors that theoretically generate a linear output signal over several decades may not be particularly compatible with such linear amplifiers. For example, photodiode sensors typically generate a response to light that is proportional to the amount of light received. Accordingly, when such sensors are used to detect daylight the amount of input varies widely from darkness to full daylight, and the sensor itself can detect and produce an output signal that is indicative of the sensed amount of light over a wide dynamic range. However, linear amplification is problematic because a tradeoff is typically made in such linear amplification circuits between the extent of the amplification (resolution) and operating signal range of the linear amplifier. That is, a linear amplifier that provides an appropriate level of resolution when the sensor output signal is configured to provide relatively low levels of output will typically be driven to provide an oversaturated response beyond which the linear amplifier provides no further resolution. Conversely, an amplifier that provides adequate resolution at the higher end of the sensor output will typically provide inadequate resolution for lower level output signals.

To solve this problem, logarithmic amplifiers can be used. One example of such a logarithmic amplifier is a Burr-Brown Precision Logarithmic and Log Ratio Amplifier, LOG104 also sold by Texas Instruments. As is noted in Texas Instruments' publication SBOS243C, published in May 2002, and revised in April 2005: "The LOG104 is a versatile integrated circuit that computes the logarithm or log ratio of an input current relative to a reference current. The LOG104 is operable over a wide dynamic range of input signals. In log ratio applications, a signal current can come from a photodiode, and a reference current from a resistor in series with a precision external reference." Unfortunately, this solution is complicated and requires non-linear conversion of the output signal which provides a predetermined relationship which may not match the performance of a particular sensor.

Accordingly, what is needed in the art are a method and circuitry that enable wide dynamic range sensing having a linear output throughout the effective range of a sensor.

SUMMARY OF THE INVENTION

In a first aspect of the invention a sensing and conditioning system are provided. The sensing and conditioning system comprises: an analog light sensor capable of converting light incident on a sensing surface into an analog light sensor current signal indicative of a range of, an amount of, an intensity of, or an exposure of the sensing surface to light; an operational amplifier having an inverse input connected to the analog light sensor, and a non-inverse input being connected to a ground, the amplifier providing an amplifier output signal at an amplifier output; an amplifier feedback loop having a resistor connected between the amplifier output and its inverse input to provide a feedback current signal at the amplifier inverse input; a comparator having a first comparator input connected to the output of the operational amplifier and a second comparator input connected to a reference circuit providing a reference signal, so that the comparator provides an output signal at a comparator output that reflects a comparison between the amplifier output signal and the reference signal; a control circuit having a control circuit input connected to the output of the comparator with said control circuit receiving the output signal from the comparator and, in response thereto, generating a control circuit output signal that has at least an integration component; an offset source circuit having an offset input connected to the control circuit output and an offset output connected to the inverse input of the operational amplifier with the offset source circuit being adapted to generate at an offset current signal at the offset output based upon the control circuit output signal, the offset current signal tending to minimize the difference between the light sensor current signal and the feedback signal so that the amplifier output signal will be controlled to be close enough to the reference signal to cause the control circuit output signal to be proportional to the light sensor signal.

DETAILED DESCRIPTION OF THE INVENTION

Figure 1:
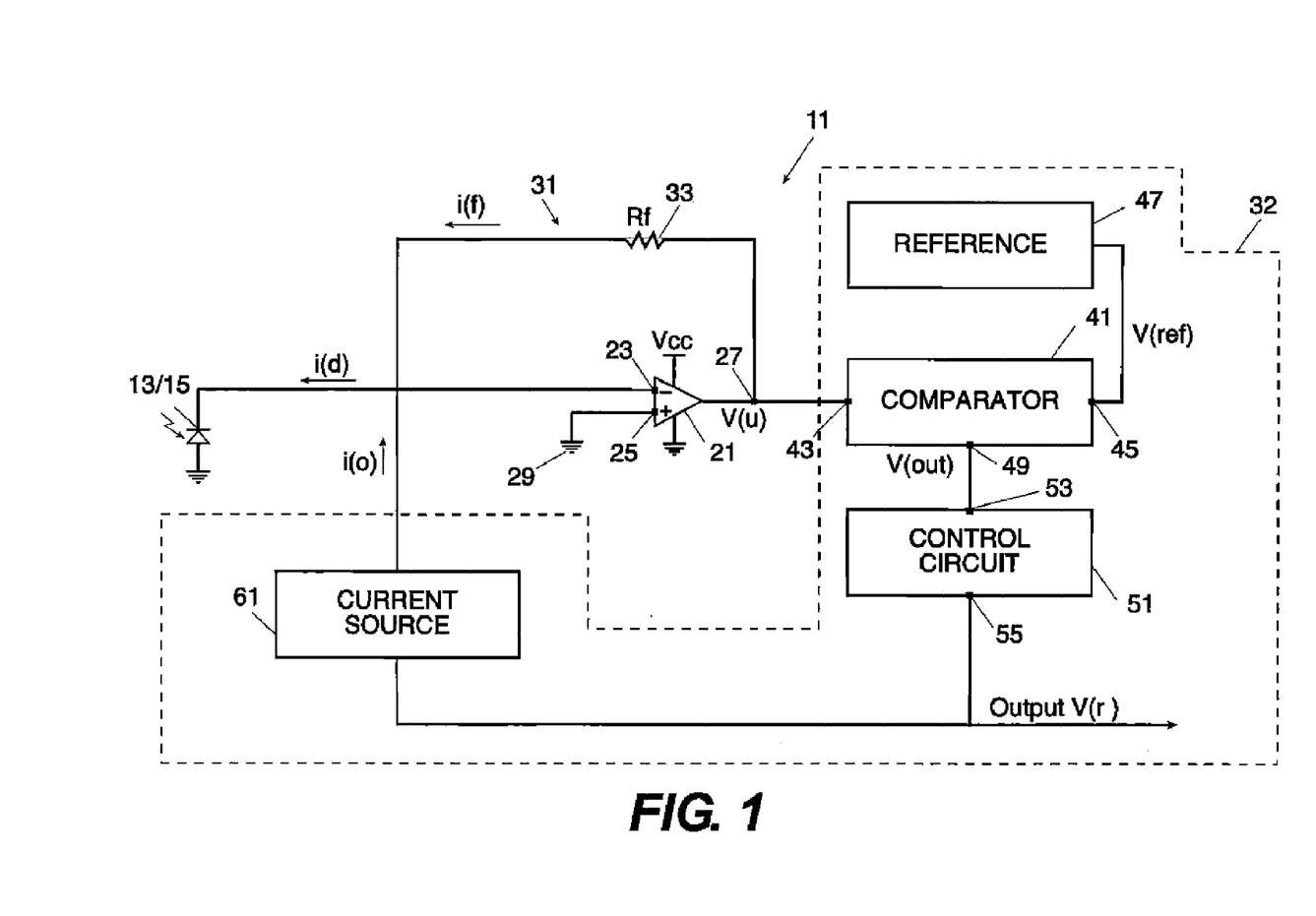
FIG. 1 is a general block-diagram describing an embodiment of the wide range photo sensor acquisition and conditioning system.

FIG. 1 is a general block-diagram showing one embodiment of a sensing and conditioning system 11. In this embodiment, system 11 has an analog light sensor 13 comprising, a photodiode 15. In other embodiments, light sensor 13 can comprise, for example, a transducer that is capable of converting light incident on a sensing surface into an analog output sensor signal indicative of a range or an amount, intensity, or an exposure of the sensing surface to light stimulus. In the embodiment of FIG. 1, photodiode 15 is shown controlling a sensor current signal i(d) in proportion to an amount of received light. In other embodiments, light sensor 13 can comprise, for example, and without limitation, a photoconductive cell or a photovoltaic cell.

As is also shown in FIG. 1, an operational amplifier 21 is provided having an inverse input 23, a non-inverse input 25 and an amplifier output 27. Inverse input 23 is connected to light sensor 13, while non-inverse input 25 is shown connected to a ground 29. A first amplifier feedback loop 31 is provided having a feedback resistor 33 with a resistance Rf connected between amplifier output 27 and inverse input 23. In operation, first amplifier feedback loop 31 provides a current-to-voltage converter that generates a feedback current signal i(f) that works to help convert the sensor current signal i(d) into an amplifier output signal V(u).

A second amplifier feedback loop 32 is shown connected between amplifier output 27 and inverse input 23. Second amplifier feedback loop 32 comprises a comparator 41, a reference signal source circuit 47, a control circuit 51 and an offset source circuit 61. Second amplifier feedback loop 32 provides an offset current signal i(o) to inverse input 23 that has at least an integration (I) component with respect to the amplifier output signal V(u). Examples of such systems that can provide an integration component with respect to a signal, such as offset current signal i(o), are known to those of skill in the art, some examples of which are provided in "Theory and Problems of Feedback and Control Systems", Second Edition, page 22, written by Joseph J. Distefano, Allen R. Stubberud, and Ivan J. Williams, publisher McGRAW-HILL).

Specifically, as shown, comparator 41 is connected at a first comparator input 43 to amplifier output 27 and is also connected at a second comparator input 45 to reference signal source circuit 47. Reference signal source circuit 47 provides a reference signal V(ref) to comparator 41. Comparator 41 provides a comparator output signal V(out) at a comparator output 49. Comparator output signal V(out) reflects a comparison between the amplifier output signal V(u) and reference signal V(ref).

Control circuit 51 has a control circuit input 53 connected to comparator output 49. In this way, control circuit 51 receives the comparator output signal V(out) and, in response thereto, generates a control circuit output signal V(r) at a control circuit output 55. Control circuit output signal V(r) is based upon the output signal received from comparator 41 and is adapted to generate the control circuit output signal V(r) to have at least integration (I) component with respect to amplifier output signal V(u).

Control circuit 51 can take any of a variety of forms. In one example embodiment, control circuit 51 can comprise an integrator circuit having an operational amplifier which performs the mathematical operation of integration such as the integrator circuit shown on National Semiconductor Application Note 20, entitled "An Applications Guide for Op Amps", published February 1969 by National Semiconductor Corporation, Santa Clara, Calif., USA.

In this embodiment, the output of control circuit 51 is connected to the input of offset source circuit 61 which, in this embodiment, comprises a controlled current source that provides an offset current signal i(o) that flows to inverse input 23 of operational amplifier 21. Offset source circuit 61 can be implemented, for example, as a resistor (not shown) which determines the offset current signal i(o) as a value proportional to the voltage applied to such a resistor.

Accordingly, in this embodiment, sensing and conditioning system 11 operates as follows: after power-up, operational amplifier 21 converts the difference of sensor current signal i(d) and the offset current signal i(o) into an amplifier output signal V(u).

The expression for V(u) may be written as:

$$V(u)=i(f)\times Rf=[i(d)-i(o)]\times Rf \qquad (1)$$

The input current of operational amplifier 21 at inverse input 23 may be neglected due to a very high input resistance of operational amplifier 21.

Amplifier output signal V(u) is compared by comparator 41 with a reference signal V(ref) which is typically a pre-set reference voltage supplied by reference signal source circuit 47. The reference signal V(ref) can comprise, for example, a voltage signal having any value within the amplifier supply voltage V(cc) of amplifier output signal V(u), for example V(ref)=V(cc)/2. Comparator 41 generates a comparator output signal V(out) that forces control circuit 51 to generate an output signal V(r). Offset source circuit 61 receives control circuit output signal V(r) and generates an output current signal that tends to reduce or minimize the difference between sensor current signal i(d) and offset current signal i(o).

In other words, amplifier output signal V(u) will be controlled to be as close as possible to the reference value V(ref) supplied by reference signal source circuit 47 such that the output signal V (r) of control circuit 51 will be proportional to sensor current signal i(d).

To perform the compensation of an increasing sensor current signal i(d), control circuit 51 is adapted to generate a control circuit output signal V(r) that causes an increase in the offset current signal i(o) thus in turn generating a larger control circuit output signal V(r). The control circuit output signal V(r) provides a linear output signal across the range of possible output signals provided by light sensor 13, due to the linear relationship between the measured light intensity and sensor current signal i(d).

Figure 2:
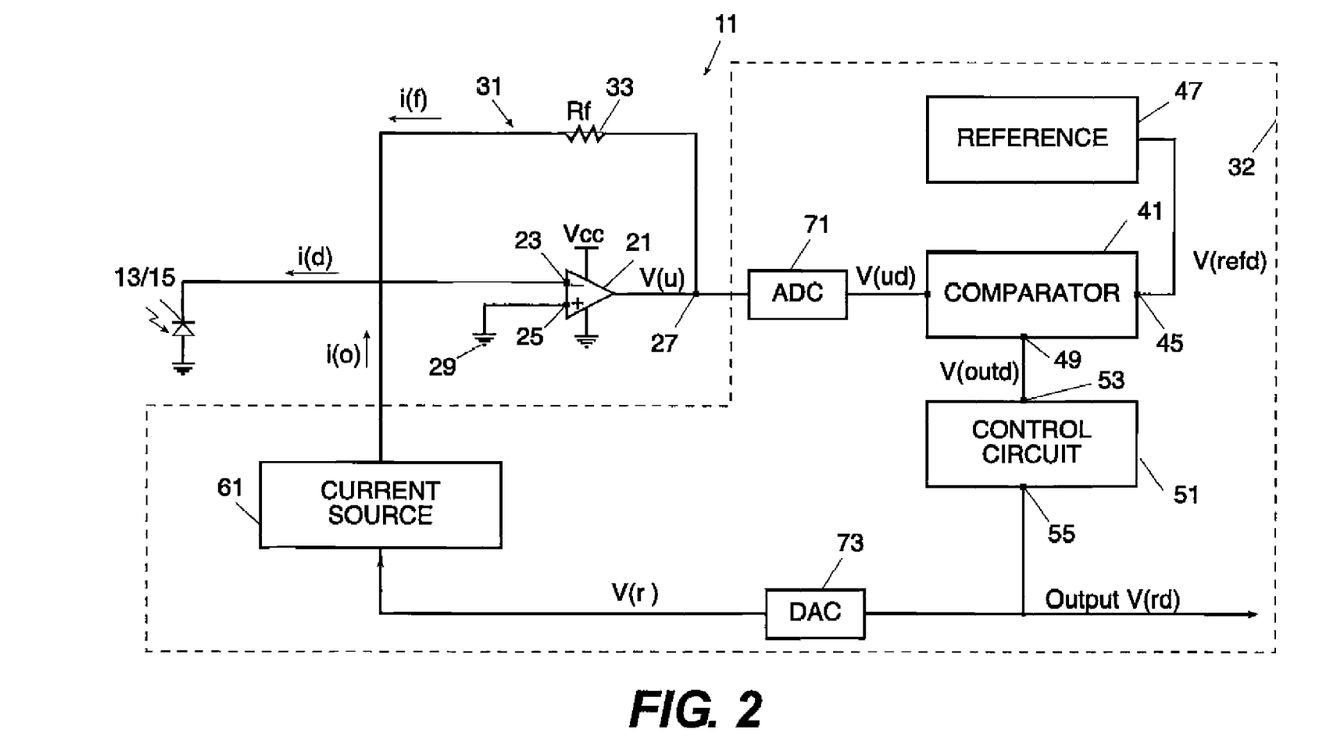
FIG. 2 is a digital version of a preferred embodiment of the wide range photo sensor acquisition and conditioning system.

FIG. 2 shows another embodiment sensing and conditioning system 11 wherein various portions of sensing and conditioning system 11 are executed using digital techniques. As shown in FIG. 2, in this embodiment, comparator 41, reference signal source circuit 47, and control circuit 51 comprise digital circuits that perform generally as described above, using digital circuitry and signals in lieu of analog circuitry and signals. To facilitate this, an analog-to-digital conversion circuit (ADC) 71 and a digital-to-analog conversion circuit (DAC) 73 are added. Specifically, as shown in FIG. 2, amplifier output signal V(u) is converted by analog-to-digital conversion circuit (ADC) 71 into a digital output signal V(ud) representing the voltage level of the output signal and the digital output signal V(ud) is provided to an input of comparator 41. Similarly, as illustrated in FIG. 2, reference signal source circuit 47 comprises a source of a digital reference signal V(refd) which can include by way of example and not by way of limitation, a digital memory, a processor, a latch or any other such circuit that can store and provide digital data comprising digital reference signal (Vrefd) for use by the digital embodiment of comparator 41 illustrated in FIG. 2.

Comparator 41 compares the digital output signal V(ud) and the digital reference signal V(refd) and generates a digital comparator output signal V(outd). Similarly, control circuit 51 receives the digital comparator output signal V(outd) and generates a digital control circuit output signal V(rd). The digital control circuit output signal V(rd) is received by digital-to-analog conversion circuit 73 and converted into an analog output signal V(r) that is then provided to offset source circuit 61. In the embodiment illustrated in FIG. 2, this digital control circuit output signal V(rd) is provided in digital form as an output signal. Alternatively, where desired, the analog output signal V(r) can be provided in analog form as an output signal.

Figure 3:
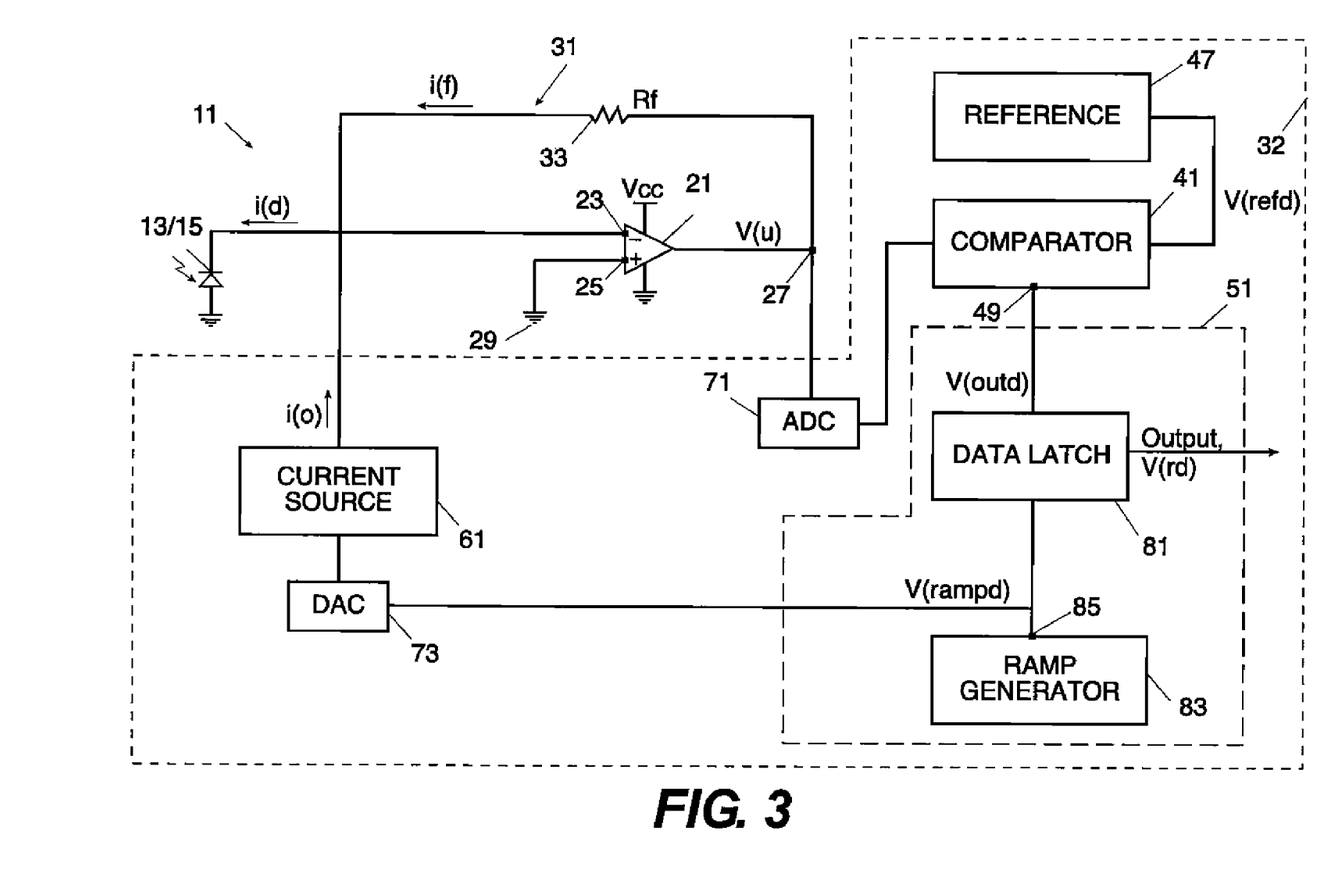
FIG. 3 is another digital version of a preferred embodiment of the wide-range photo sensor acquisition and conditioning system.

FIG. 3 shows yet another embodiment of a sensing and conditioning system 11. This embodiment incorporates features of the embodiment of FIG. 2, having a control circuit 51 comprising a data latch circuit 81 and a ramp generator circuit 83. In this embodiment, ramp generator circuit 83 which can comprise, for example, and without limitation a counter circuit, generates a digital ramp output signal V(rampd) at its output 85, that is provided to both digital-to-analog converter 73 and to data latch 81. Digital-to-analog converter 73 converts the digital ramp output signal V(rampd) to an analog signal controlling offset source circuit 61, thus creating an offset current signal i(o) which is periodically changing from a predetermined minimum to a maximum offset current value. This causes the amplifier output signal V(u) to change according to equation (1). At the moment when V(u) will be equal to a predetermined value—for example, to half of the effective range of the amplifier output signal V(u)—set by the digital reference signal V(refd) from reference signal source 47. Comparator 41 then generates the equality signal to latch the corresponding ramp generator 83 output signal V(rampd). This latched data, representing the output V(rd) of data latch 81, will be proportional to the measured light level at sensor 13. As can be seen from this description the output V(rd) latched data will change once per ramp generator 83 period. As known in the art, the ramp frequency should be fast enough to cope with the light variations at sensor 13 and slow enough to allow a good resolution at a wide measurement range.

Figure 4:
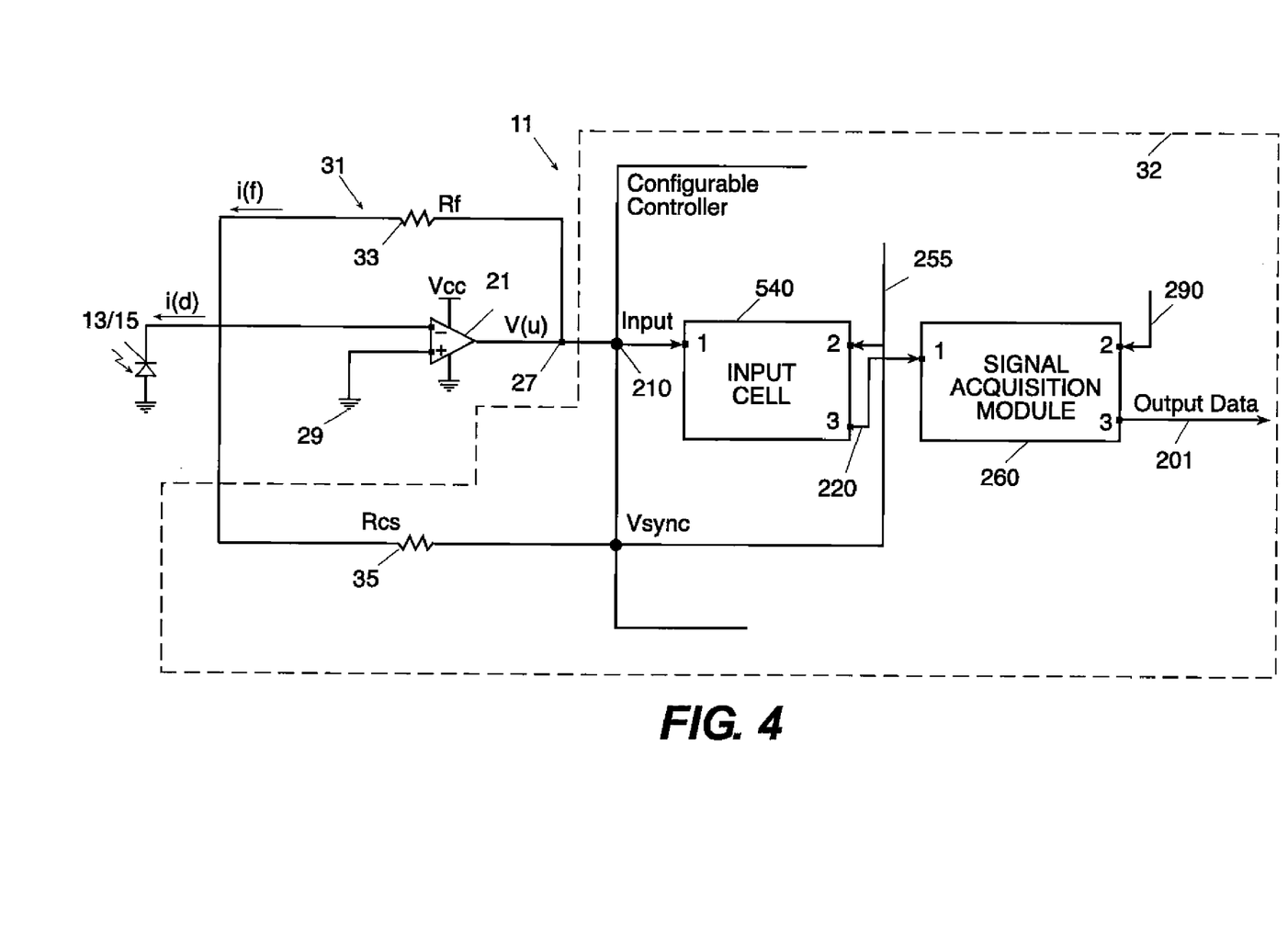
FIG. 4 is another digital version, employing a configurable controller, of a preferred embodiment of the wide-range photo sensor acquisition and conditioning system.
Figure 5:
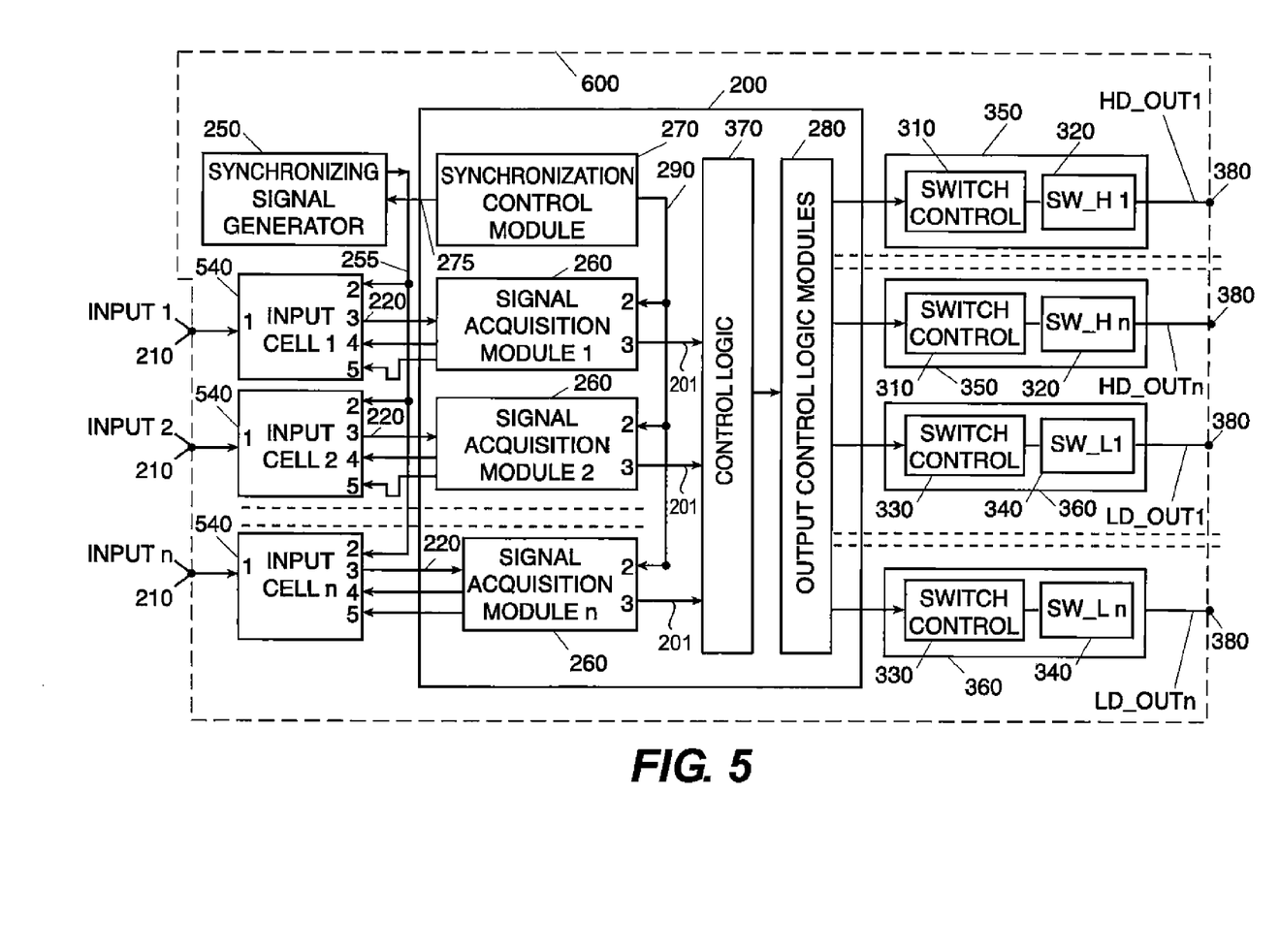
FIG. 5 is a block diagram of a configurable controller useful for the digital version of FIG. 4.

FIGS. 4 and 5 show an embodiment similar to the embodiment of FIG. 3 wherein functions of digital control circuit 51 are performed by modules of a configurable control system, as described, for example, in WO 2005/029207 entitled CONFIGURABLE CONTROLLER filed Jul. 12, 2004 in the name of Burkatovsky and U.S. Ser. No. 11/472,142 entitled AN ADAPTIVE INPUT-CELL CIRCUITRY USEFUL IN CONFIGURABLE ELECTRONIC CONTROLLERS, filed Jun. 21, 2006 in the name of Burkatovsky. The block diagram of the configurable control system 600, as shown originally in FIG. 3 of U.S. Ser. No. 11/472,142, is copied here to FIG. 5.

Specifically, FIG. 5 is a general block diagram of one embodiment of a configurable control system 600 that uses a plurality of adaptive input-cells 500. Configurable control system 600 is substantially similar to the controller illustrated in FIG. 3 of WO 2005/029207, except for the adaptive input-cell 500, which replaces the original basic input-cell 240. Configurable control system 600 comprises a synchronizing signal generator 250, configurable digital unit 200, such as a FPGA or CPLD, which comprises at least synchronization control module 270, control logic module 370, a number of signal acquisition modules 260, configured to accept signals coming from input pins 210 of configurable control system 600 through adaptive input-cells 500. Adaptive input-cells 500 can be identical or can vary.

Configurable output control logic modules 280 can be configured to provide control of the loads connected to the output pins 380 of configurable control system 600, through high-side output drivers 350 and/or low-side output drivers 360. In this embodiment, such high-side output drivers 350 each have a high-side switch control 310 and high-side switch 320, while such low-side output drivers 360 each have a low-side switch control 330 and low-side switch 340.

The synchronization control module 270 of configurable control system 600 is configured to generate basic time-dependent signals, in order to synchronize the work of the adaptive input-cells 540 and signal acquisition modules 260. Such synchronization is needed for conversion of input signal values to time-based parameter, (e.g. pulse width, delay, duty cycle, frequency, etc.) by adaptive input-cells 540, and then for converting these time-based parameters to digital form by means of configured signal acquisition modules 260. One possible implementation of synchronization control module 270 may be, for example, a counter, which counts incoming pulses with constant interval between them. The sequence of such pulses can be obtained from the system clock, for example. The output reference data 290 of synchronization control module 270 is connected to each of the signal acquisition modules 260 and also to synchronizing signal generator 250 as a sync data 275. Synchronizing signal generator 250 is implemented, for example, as a digital to analogue converter.

Synchronization control module 270 is connected to each of the signal acquisition modules 260 and also to synchronizing signal generator 250 as a sync data 275. While synchronization control module 270 is running, the value of the sync data 275, which is equal to output reference data 290, is periodically changed from 0 to its maximum value, which causes a saw-teeth shape synchronization voltage Vsync on the synchronization input 255 of synchronizing signal generator 250. This voltage is transferred to the second input of adaptive input-cells 540. First input 522 of each adaptive input-cell 540 is connected to a corresponding signal input pin 210 of configurable control system 600 respectively. The comparator output signal 220 of adaptive input-cell 540 is connected to the input of corresponding signal acquisition module 260. The implementation of configurable signal acquisition modules 260 may vary according to the type of signal that needs to be accepted and thus supports the different peripheral environments.

In the embodiment of FIGS. 4 and 5, the functions of reference signal source 47, comparator 41, data latch 81, ramp generator 83, analog-to-digital converter 71 and digital-to-analog converter 73 of the embodiment of FIG. 3 are performed using modules that are part of configurable control system 600 of FIG. 5. As shown in FIG. 4, input-cell 540 and signal acquisition module 260 of FIG. 5, properly configured, serve to measure V(u) and express it in digital values. Synchronizing signal generator 250 and synchronization control module 270 of configurable control system 600 are used to provide the waveform V(sync) of FIG. 4, which is substantially similar to the functionality of V (rampd) and digital-to-analog converter 73 of FIG. 3. A compensation circuit resistor Rcs 35 of FIG. 4 defines the offset current signal i(o) range. Signal acquisition module 260 can be configured to perform all control functions required to maintain a linear measurement of light sensor 13, within its entire wide-range output, at its output marked output data 201, which is practically the equivalent of Output V(rd) of FIG. 3.

The light intensity acquired by a daylight sensor between daytime and night varies in order of magnitude 1000 and more. Using any of the embodiments described above, the available output marked V(r), V(rd) or output data 201 will enable linear measurement of the daylight sensor with good sensitivity over the entire illumination range and without the use of a logarithmic amplifier.

It will be appreciated where such analog light sensors 13 do not inherently generate sensor signals of the type that are described herein, simple pre-conditioning circuits, known to those of skill in the art, can be used to pre-condition the sensor signal so that it is compatible with the sensing and conditioning system 11 described herein.

The invention has been described in detail with particular reference to certain preferred embodiments thereof, but it will be understood that variations and modifications can be effected within the spirit and scope of the invention.

PARTS LIST 11 sensing and conditioning system
13 analog light sensor
15 photodiode
21 operational amplifier
23 inverse input of operational amplifier
25 non-inverse input of operational amplifier
27 operational amplifier output
29 ground
31 first amplifier feedback loop
32 second amplifier feedback loop
33 feedback resistor
35 resistor
41 comparator
43 first comparator input
45 second comparator input
47 reference signal source circuit
49 comparator output
51 control circuit
53 control circuit input
55 control circuit output
61 current source circuit
71 analog-to-digital converter (ADC)
73 digital-to-analog converter (DAC)
81 data latch circuit
83 ramp generator
200 configurable digital unit
201 output data
210 signal input pins
220 comparator output signal
250 synchronization signal generator
255 waveform vsync
260 signal acquisition module
270 synchronization control module
275 sync data
280 configurable output control logic module
290 output reference data
310 high-side switch control
320 high-side switch
330 low-side switch control
340 low-side switch
350 high-side output driver
360 low-side output driver
370 control logic module
380 output pins
522 first input
540 input cell
600 configurable control system
i(d) sensor current signal
i(f) feedback current signal
i(o) offset current signal
Vsync synchronization voltage
V(cc) amplifier supply voltage
V(r) control circuit output signal
V(rd) digital control circuit output signal
V(ramp) ramp output signal
V(rampd) digital ramp output signal
V(ref) reference signal
V(refd) digital reference signal
V(out) comparator output signal
V(outd) digital comparator output signal
V(u) amplifier output signal
V(ud) digital output signal

The invention claimed is:

1. A sensing and conditioning system comprising:

an analog light sensor capable of converting a sensed input surface into an analog sensor current signal indicative of a range of, an amount of, an intensity of, or an exposure of the sensor to light;

an operational amplifier having an inverse input connected to the analog light sensor, and a non-inverse input being connected to a ground, the amplifier providing an amplifier output signal at an amplifier output;

an amplifier feedback loop having a resistor connected between the amplifier output and its inverse input to provide a feedback current signal at the amplifier inverse input;

a comparator having a first comparator input connected to the output of the operational amplifier and a second comparator input connected to a reference circuit providing a reference signal, so that the comparator provides an output signal at a comparator output that reflects a comparison between the amplifier output signal and the reference signal;

a control circuit having a control circuit input connected to the output of the comparator with said control circuit receiving the output signal from the comparator and, in response thereto, generating a control circuit output signal that has at least an integration component; and an offset source circuit having an offset input connected to the control circuit output and an offset output connected to the inverse input of the operational amplifier, and being adapted to generate an offset current signal at the offset output based upon the control circuit output signal, said offset current signal tending to minimize the difference between the light sensor signal and the feedback signal, so that said amplifier output signal will be controlled to be close enough to the reference signal to cause the control circuit output signal to be proportional to the light sensor signal.

2. The sensing and conditioning system of claim 1, wherein the operational amplifier is a trans-impedance operational amplifier.

3. The sensing and conditioning system of claim 1, wherein the analog light sensor generates an output signal that comprises a transducer that generates an analog output signal in proportion to the amount of light incident on a sensing surface.

4. The sensing and conditioning system of claim 1, further comprising an analog-to-digital converter converting the an output signal at the output of the amplifier into an amplifier output signal in digital form, wherein the reference signal source provides the reference signal in digital form, and the comparator compares the amplifier output signal to the digital reference signal in digital form.

5. The sensing and conditioning system of claim 4, further comprising a digital-to-analog converter adapted to receive a digital output signal from the control circuit and to provide a control circuit output signal in analog form.

6. A sensing and conditioning system adapted for use with a light sensor that senses light and that provides a sensor signal that is proportional thereto, said sensor signal having a substantially linear wide-range of response to said input stimulus, the circuit comprising:

an operational amplifier having an input connected to the light sensor to receive the sensor signal;

a first feedback loop having a feedback resistor connected between an output of the operational amplifier and the input of the operational amplifier to which the sensor is connected to apply a first feedback signal to the input based upon an amplifier output signal provided at the amplifier output;

a second feedback loop connected between the output of the operational amplifier and the input of the operational amplifier having:

a source of a reference signal;

a comparator adapted to compare the reference signal to the output signal from the amplifier and to generate a comparator output signal; and a control circuit adapted to generate a control circuit output signal that is based upon the comparator output signal and that drives an offset source to generate an offset signal to interact with the sensor signal and the first feedback signal at the input of the operational amplifier;

said control circuit output signal having at least an integration component relative to the comparator output signal, said control circuit output signal causing said offset source to generate an offset signal that is applied to the input of the operational amplifier, so that the combined effect of the first and second feedback loops tends to keep the control circuit output signal proportional to the sensor signal and within a range of output signals that the amplifier is capable of generating.

7. The sensing and conditioning system of claim 6, wherein the control circuit comprises an adaptive controller.

8. A method for conditioning a signal from a sensor, said sensor generating an input current signal in response to the sensed light intensity, the method comprising the steps of:

receiving the input current signal from the sensor;

converting the input current signal into an amplified output voltage signal;

comparing the amplified output voltage signal to a reference voltage signal;

generating a comparator output signal based upon said comparing; and generating a control circuit output signal based upon the comparator output signal; said control circuit output signal being adapted to drive an offset source circuit to generate an offset current signal to interact with the input current signal and the first feedback signal;

wherein said control circuit output signal having at least an integration component relative to the comparator output signal, said control circuit output signal causing said offset source to generate an offset current signal that is applied to the input of the amplifier, so that the combined effect of the first and second feedback loops tends to keep the control circuit output signal proportional to the input current signal from the sensor.

* * * * *